US008331572B2

(12) United States Patent
Breebaart et al.

(10) Patent No.: US 8,331,572 B2
(45) Date of Patent: Dec. 11, 2012

(54) SPATIAL AUDIO

(75) Inventors: Dirk Jeroen Breebaart, Eindhoven (NL); Steven Leonardus Josephus Dimphina Elisabeth Van De Par, Goirle (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 393 days.

(21) Appl. No.: 12/509,529

(22) Filed: Jul. 27, 2009

(65) Prior Publication Data

US 2009/0287495 A1 Nov. 19, 2009

Related U.S. Application Data

(62) Division of application No. 10/511,807, filed on Oct. 19, 2004.

(30) Foreign Application Priority Data

| | | |
|---|---|---|
| Apr. 22, 2002 | (EP) | 02076588 |
| Jul. 12, 2002 | (EP) | 02077863 |
| Oct. 14, 2002 | (EP) | 02079303 |
| Nov. 20, 2002 | (EP) | 02079817 |

(51) Int. Cl.

| | |
|---|---|
| ***H04R 5/00*** | (2006.01) |
| ***H04R 3/00*** | (2006.01) |
| ***H03G 5/00*** | (2006.01) |
| ***G10L 19/00*** | (2006.01) |
| ***G10L 11/00*** | (2006.01) |

(52) U.S. Cl. .............. 381/22; 381/100; 381/17; 381/18; 381/23; 381/94.1; 704/278; 704/500; 704/E19.005

(58) Field of Classification Search .............. 381/17–23, 381/100, 94.1–94.3; 704/278, 500, 200, 704/E19.005

See application file for complete search history.

(56) References Cited

U.S. PATENT DOCUMENTS

| | | | | |
|---|---|---|---|---|
| 5,621,855 | A | 4/1997 | Veldhuis et al. | |
| 6,271,771 | B1 | 8/2001 | Seitzer et al. | |
| 2003/0035553 | A1* | 2/2003 | Baumgarte et al. | 381/94.2 |

FOREIGN PATENT DOCUMENTS

| | | | |
|---|---|---|---|
| EP | 1107232 | A2 | 6/2001 |
| GB | 2353926 | A | 3/2001 |
| WO | 9904498 | A2 | 1/1999 |
| WO | 9931938 | A1 | 6/1999 |

OTHER PUBLICATIONS

Faller et al: "Efficient Representation of Spatial Audio Using Perceptual Parametrization"; Proceedings of the 2001—IEEE Workshop on the Applications of Signal Processing to Audio Acoustics, New Paltz, NY, Oct. 21-24, 2001, pp. 199-202.

(Continued)

*Primary Examiner* — Devona Faulk

(57) ABSTRACT

In summary, this application describes a psycho-acoustically motivated, parametric description of the spatial attributes of multichannel audio signals. This parametric description allows strong bitrate reductions in audio coders, since only one monaural signal has to be transmitted, combined with (quantized) parameters which describe the spatial properties of the signal. The decoder can form the original amount of audio channels by applying the spatial parameters. For near-CD-quality stereo audio, a bitrate associated with these spatial parameters of 10 kbit/s or less seems sufficient to reproduce the correct spatial impression at the receiving end.

10 Claims, 2 Drawing Sheets

OTHER PUBLICATIONS

Van Der Waal et al: "Subband Coding of Stereophonic Digital Audio Signals"; Speech Processing 2, VLSI, Under Water Signal Processing, Toronto, May 14-17, International Conference on Acoustics, Speech & Signal Processing, ICASSP, Apr. 14, 1991, vol. 2, Conf. 16, Apr. 14, 1991, pp. 3601-3604.

Bosi et al: "ISO/IEC MPEG-2 Advanced Audio Coding"; Journal of the Audio Engineering Society, vol. 45, No. 10, Oct. 1, 1997, pp. 789-812.

Breebaart et al: "Effective Signal Processing of the Binaural Auditory System"; for a Description of the Binaural Processing Model, 2001.

Breebaart et al: "Binaural Processing Model Based on Contralateral Inhibition. I. Model Structure"; J. Acoust. Soc. Am. vol. 110, No. 2, Aug. 2001, pp. 1074-1088.

Breebaart et al: "Binaural Processing Model Based on Contralateral Inhibition. II. Dependence on Spectral Parameters"; J. Acoust. Soc. Am. vol. 110, No. 2, Aug. 2001, pp. 1089-1104.

Breebaart et al:"Binaural Processing Model Based on Contralateral Inhibition. III, Dependence on Temporal Parameters"; J. Accoust. Soc. Am. vol. 110, No. 2, Aug. 2001, pp. 1105-1117.

Princen et al: "Analysis/Synthesis Filterbank Design Based on Time Domain Aliasing Cancellation"; IEEE Transactions on Acoustics, Speech and Signal Processing, vol. ASSP-34, No. 5, Oct. 1986, pp. 1153-1161.

Bergmans, "Digital Basedband Transmission and Recording"; Philips Research, Kluwer Academic Publishers, 1996, pp. 122-129.

Schroeder, M.: Synthesis of Low-Peak-Factor Signals and Binary Sequences With Low Autocorrelation, IEEE Transaction Inf. Theor., vol. 16, pp. 85-89.

* cited by examiner

SPATIAL AUDIO

FIELD OF THE INVENTION

This invention relates to the coding of audio signals and, more particularly, the coding of multi-channel audio signals.

BACKGROUND OF THE INVENTION

Within the field of audio coding it is generally desired to encode an audio signal, e.g. in order to reduce the bit rate for communicating the signal or the storage requirement for storing the signal, without unduly compromising the perceptual quality of the audio signal. This is an important issue when audio signals are to be transmitted via communications channels of limited capacity or when they are to be stored on a storage medium having a limited capacity.

Prior solutions in audio coders that have been suggested to reduce the bitrate of stereo program material include:

'Intensity stereo'. In this algorithm, high frequencies (typically above 5 kHz) are represented by a single audio signal (i.e., mono), combined with time-varying and frequency-dependent scalefactors.

'M/S stereo'. In this algorithm, the signal is decomposed into a sum (or mid, or common) and a difference (or side, or uncommon) signal. This decomposition is sometimes combined with principle component analysis or time-varying scalefactors. These signals are then coded independently, either by a transform coder or waveform coder. The amount of information reduction achieved by this algorithm strongly depends on the spatial properties of the source signal. For example, if the source signal is monaural, the difference signal is zero and can be discarded. However, if the correlation of the left and right audio signals is low (which is often the case), this scheme offers only little advantage.

Parametric descriptions of audio signals have gained interest during the last years, especially in the field of audio coding. It has been shown that transmitting (quantized) parameters that describe audio signals requires only little transmission capacity to resynthesize a perceptually equal signal at the receiving end. However, current parametric audio coders focus on coding monaural signals, and stereo signals are often processed as dual mono.

European patent application EP 1 107 232 discloses a method of encoding a stereo signal having an L and an R component, where the stereo signal is represented by one of the stereo components and parametric information capturing phase and level differences of the audio signal. At the decoder, the other stereo component is recovered based on the encoded stereo component and the parametric information.

SUMMARY OF THE INVENTION

It is an object of the present invention to solve the problem of providing an improved audio coding that yields a high perceptual quality of the recovered signal.

The above and other problems are solved by a method of coding an audio signal, the method comprising:

- generating a monaural signal comprising a combination of at least two input audio channels,
- determining a set of spatial parameters indicative of spatial properties of the at least two input audio channels, the set of spatial parameters including a parameter representing a measure of similarity of waveforms of the at least two input audio channels, and
- generating an encoded signal comprising the monaural signal and the set of spatial parameters.

It has been realized by the inventor that by encoding a multi-channel audio signal as a monaural audio signal and a number of spatial attributes comprising a measure of similarity of the corresponding waveforms, the multi-channel signal may be recovered with a high perceptual quality. It is a further advantage of the invention that it provides an efficient encoding of a multi-channel signal, i.e. a signal comprising at least a first and second channel, e.g. a stereo signal, a quadraphonic signal, etc.

Hence, according to an aspect of the invention, spatial attributes of multi-channel audio signals are parameterized. For general audio coding applications, transmitting these parameters combined with only one monaural audio signal strongly reduces the transmission capacity necessary to transmit the stereo signal compared to audio coders that process the channels independently, while maintaining the original spatial impression. An important issue is that although people receive waveforms of an auditory object twice (once by the left ear and once by the right ear), only a single auditory object is perceived at a certain position and with a certain size (or spatial diffuseness).

Therefore, it seems unnecessary to describe audio signals as two or more (independent) waveforms and it would be better to describe multi-channel audio as a set of auditory objects, each with its own spatial properties. One difficulty that immediately arises is the fact that it is almost impossible to automatically separate individual auditory objects from a given ensemble of auditory objects, for example a musical recording. This problem can be circumvented by not splitting the program material in individual auditory objects, but rather describing the spatial parameters in a way that resembles the effective (peripheral) processing of the auditory system. When the spatial attributes comprise a measure of (dis)similarity of the corresponding waveforms, an efficient coding is achieved while maintaining a high level of perceptual quality.

In particular, the parametric description of multi-channel audio presented here is related to the binaural processing model presented by Breebaart et al. This model aims at describing the effective signal processing of the binaural auditory system. For a description of the binaural processing model by Breebaart et al., see Breebaart, J., van de Par, S. and Kohlrausch, A. (2001a). Binaural processing model based on contralateral inhibition. I. Model setup. *J. Acoust. Soc. Am.,* 110, 1074-1088; Breebaart, J., van de Par, S. and Kohlrausch, A. (2001b). Binaural processing model based on contralateral inhibition. II. Dependence on spectral parameters. *J. Acoust. Soc. Am.,* 110, 1089-1104; and Breebaart, J., van de Par, S. and Kohlrausch, A. (2001c). Binaural processing model based on contralateral inhibition. III. Dependence on temporal parameters. *J. Acoust. Soc. Am.,* 110, 1105-1117. A short interpretation is given below which helps to understand the invention.

In a preferred embodiment, the set of spatial parameters includes at least one localization cue. When the spatial attributes comprise one or more, preferably two, localization cues as well as a measure of (dis)similarity of the corresponding waveforms, a particularly efficient coding is achieved while maintaining a particularly high level of perceptual quality.

The term localization cue comprises any suitable parameter conveying information about the localization of auditory objects contributing to the audio signal, e.g. the orientation of and/or the distance to an auditory object.

In a preferred embodiment of the invention, the set of spatial parameters includes at least two localization cues comprising an interchannel level difference (ILD) and a selected one of an interchannel time difference (ITD) and an interchannel phase difference (IPD). It is interesting to mention that the interchannel level difference and the interchannel time difference are considered to be the most important localization cues in the horizontal plane.

The measure of similarity of the waveforms corresponding to the first and second audio channels may be any suitable function describing how similar or dissimilar the corresponding waveforms are. Hence, the measure of similarity may be an increasing function of similarity, e.g. a parameter determined from to the interchannel cross-correlation (function).

According to a preferred embodiment, the measure of similarity corresponds to a value of a cross-correlation function at a maximum of said cross-correlation function (also known as coherence). The maximum interchannel cross-correlation is strongly related to the perceptual spatial diffuseness (or compactness) of a sound source, i.e. it provides additional information which is not accounted for by the above localization cues, thereby providing a set of parameters with a low degree of redundancy of the information conveyed by them and, thus, providing an efficient coding.

It is noted that, alternatively, other measures of similarity may be used, e.g. a function increasing with the dissimilarity of the waveforms. An example of such a function is 1-c, where c is a cross-correlation that may assume values between 0 and 1.

According to a preferred embodiment of the invention, the step of determining a set of spatial parameters indicative of spatial properties comprises determining a set of spatial parameters as a function of time and frequency.

It is an insight of the inventors that it is sufficient to describe spatial attributes of any multichannel audio signal by specifying the ILD, ITD (or IPD) and the maximum correlation as a function of time and frequency.

In a further preferred embodiment of the invention, the step of determining a set of spatial parameters indicative of spatial properties comprises

- dividing each of the at least two input audio channels into corresponding pluralities of frequency bands;
- for each of the plurality of frequency bands determining the set of spatial parameters indicative of spatial properties of the at least two input audio channels within the corresponding frequency band.

Hence, the incoming audio signal is split into several band-limited signals, which are (preferably) spaced linearly at an ERB-rate scale. Preferably the analysis filters show a partial overlap in the frequency and/or time domain. The bandwidth of these signals depends on the center frequency, following the ERB rate. Subsequently, preferably for every frequency band, the following properties of the incoming signals are analyzed:

- The interchannel level difference, or ILD, defined by the relative levels of the band-limited signal stemming from the left and right signals,
- The interchannel time (or phase) difference (ITD or IPD), defined by the interchannel delay (or phase shift) corresponding to the position of the peak in the interchannel cross-correlation function, and
- The (dis)similarity of the waveforms that can not be accounted for by ITDs or ILDs, which can be parameterized by the maximum interchannel cross-correlation (i.e., the value of the normalized cross-correlation function at the position of the maximum peak, also known as coherence).

The three parameters described above vary over time; however, since the binaural auditory system is very sluggish in its processing, the update rate of these properties is rather low (typically tens of milliseconds).

It may be assumed here that the (slowly) time-varying properties mentioned above are the only spatial signal properties that the binaural auditory system has available, and that from these time and frequency dependent parameters, the perceived auditory world is reconstructed by higher levels of the auditory system.

An embodiment of the current invention aims at describing a multichannel audio signal by:

- one monaural signal, consisting of a certain combination of the input signals, and
- a set of spatial parameters: two localization cues (ILD, and ITD or IPD) and a parameter that describes the similarity or dissimilarity of the waveforms that cannot be accounted for by ILDs and/or ITDs (e.g., the maximum of the cross-correlation function) preferably for every time/frequency slot. Preferably, spatial parameters are included for each additional auditory channel.

An important issue of transmission of parameters is the accuracy of the parameter representation (i.e., the size of quantization errors), which is directly related to the necessary transmission capacity.

According to yet another preferred embodiment of the invention, the step of generating an encoded signal comprising the monaural signal and the set of spatial parameters comprises generating a set of quantized spatial parameters, each introducing a corresponding quantization error relative to the corresponding determined spatial parameter, wherein at least one of the introduced quantization errors is controlled to depend on a value of at least one of the determined spatial parameters.

Hence, the quantization error introduced by the quantization of the parameters is controlled according to the sensitivity of the human auditory system to changes in these parameters. This sensitivity strongly depends on the values of the parameters itself. Hence, by controlling the quantization error to depend on the values of the parameters, and improved encoding is achieved.

It is an advantage of the invention that it provides a decoupling of monaural and binaural signal parameters in audio coders. Hence, difficulties related to stereo audio coders are strongly reduced (such as the audibility of interaurally uncorrelated quantization noise compared to interaurally correlated quantization noise, or interaural phase inconsistencies in parametric coders that are encoding in dual mono mode).

It is a further advantage of the invention that a strong bitrate reduction is achieved in audio coders due to a low update rate and low frequency resolution required for the spatial parameters. The associated bitrate to code the spatial parameters is typically 10 kbit/s or less (see the embodiment described below).

It is a further advantage of the invention that it may easily be combined with existing audio coders. The proposed scheme produces one mono signal that can be coded and decoded with any existing coding strategy. After monaural decoding, the system described here regenerates a stereo multichannel signal with the appropriate spatial attributes.

The set of spatial parameters can be used as an enhancement layer in audio coders. For example, a mono signal is transmitted if only a low bitrate is allowed, while by including the spatial enhancement layer the decoder can reproduce stereo sound.

It is noted that the invention is not limited to stereo signals but may be applied to any multi-channel signal comprising n channels (n>1). In particular, the invention can be used to generate n channels from one mono signal, if (n−1) sets of spatial parameters are transmitted. In this case, the spatial parameters describe how to form the n different audio channels from the single mono signal.

The present invention can be implemented in different ways including the method described above and in the following, a method of decoding a coded audio signal, an encoder, a decoder, and further product means, each yielding one or more of the benefits and advantages described in connection with the first-mentioned method, and each having one or more preferred embodiments corresponding to the preferred embodiments described in connection with the first-mentioned method and disclosed in the dependant claims.

It is noted that the features of the method described above and in the following may be implemented in software and carried out in a data processing system or other processing means caused by the execution of computer-executable instructions. The instructions may be program code means loaded in a memory, such as a RAM, from a storage medium or from another computer via a computer network. Alternatively, the described features may be implemented by hardwired circuitry instead of software or in combination with software.

The invention further relates to an encoder for coding an audio signal, the encoder comprising:

- means for generating a monaural signal comprising a combination of at least two input audio channels,
- means for determining a set of spatial parameters indicative of spatial properties of the at least two input audio channels, the set of spatial parameters including a parameter representing a measure of similarity of waveforms of the at least two input audio channels, and
- means for generating an encoded signal comprising the monaural signal and the set of spatial parameters.

It is noted that the above means for generating a monaural signal, the means for determining a set of spatial parameters as well as means for generating an encoded signal may be implemented by any suitable circuit or device, e.g. as general- or special-purpose programmable microprocessors, Digital Signal Processors (DSP), Application Specific Integrated Circuits (ASIC), Programmable Logic Arrays (PLA), Field Programmable Gate Arrays (FPGA), special purpose electronic circuits, etc., or a combination thereof.

The invention further relates to an apparatus for supplying an audio signal, the apparatus comprising:

- an input for receiving an audio signal,
- an encoder as described above and in the following for encoding the audio signal to obtain an encoded audio signal, and
- an output for supplying the encoded audio signal.

The apparatus may be any electronic equipment or part of such equipment, such as stationary or portable computers, stationary or portable radio communication equipment or other handheld or portable devices, such as media players, recording devices, etc. The term portable radio communication equipment includes all equipment such as mobile telephones, pagers, communicators, i.e. electronic organizers, smart phones, personal digital assistants (PDAs), handheld computers, or the like.

The input may comprise any suitable circuitry or device for receiving a multi-channel audio signal in analogue or digital form, e.g. via a wired connection, such as a line jack, via a wireless connection, e.g. a radio signal, or in any other suitable way.

Similarly, the output may comprise any suitable circuitry or device for supplying the encoded signal. Examples of such outputs include a network interface for providing the signal to a computer network, such as a LAN, an Internet, or the like, communications circuitry for communicating the signal via a communications channel, e.g. a wireless communications channel, etc. In other embodiments, the output may comprise a device for storing a signal on a storage medium.

The invention further relates to an encoded audio signal, the signal comprising:

- a monaural signal comprising a combination of at least two audio channels, and
- a set of spatial parameters indicative of spatial properties of the at least two input audio channels, the set of spatial parameters including a parameter representing a measure of similarity of waveforms of the at least two input audio channels.

The invention further relates to a storage medium having stored thereon such an encoded signal. Here, the term storage medium comprises but is not limited to a magnetic tape, an optical disc, a digital video disk (DVD), a compact disc (CD or CD-ROM), a mini-disc, a hard disk, a floppy disk, a ferroelectric memory, an electrically erasable programmable read only memory (EEPROM), a flash memory, an EPROM, a read only memory (ROM), a static random access memory (SRAM), a dynamic random access memory (DRAM), a synchronous dynamic random access memory (SDRAM), a ferromagnetic memory, optical storage, charge coupled devices, smart cards, a PCMCIA card, etc.

The invention further relates to a method of decoding an encoded audio signal, the method comprising:

- obtaining a monaural signal from the encoded audio signal, the monaural signal comprising a combination of at least two audio channels,
- obtaining a set of spatial parameters from the encoded audio signal, the set of spatial parameters including a parameter representing a measure of similarity of waveforms of the at least two audio channels, and
- generating a multi-channel output signal from the monaural signal and the spatial parameters.

The invention further relates to a decoder for decoding an encoded audio signal, the decoder comprising:

- means for obtaining a monaural signal from the encoded audio signal, the monaural signal comprising a combination of at least two audio channels,
- means for obtaining a set of spatial parameters from the encoded audio signal, the set of spatial parameters including a parameter representing a measure of similarity of waveforms of the at least two audio channels, and
- means for generating a multi-channel output signal from the monaural signal and the spatial parameters.

It is noted that the above means may be implemented by any suitable circuit or device, e.g. as general- or special-purpose programmable microprocessors, Digital Signal Processors (DSP), Application Specific Integrated Circuits (ASIC), Programmable Logic Arrays (PLA), Field Programmable Gate Arrays (FPGA), special purpose electronic circuits, etc., or a combination thereof.

The invention further relates to an apparatus for supplying a decoded audio signal, the apparatus comprising:

- an input for receiving an encoded audio signal,
- a decoder as described above and in the following for decoding the encoded audio signal to obtain a multi-channel output signal,
- an output for supplying or reproducing the multi-channel output signal.

The apparatus may be any electronic equipment or part of such equipment as described above.

The input may comprise any suitable circuitry or device for receiving a coded audio signal. Examples of such inputs include a network interface for receiving the signal via a computer network, such as a LAN, an Internet, or the like, communications circuitry for receiving the signal via a communications channel, e.g. a wireless communications channel, etc. In other embodiments, the input may comprise a device for reading a signal from a storage medium.

Similarly, the output may comprise any suitable circuitry or device for supplying a multi-channel signal in digital or analogue form.

BRIEF DESCRIPTION OF THE DRAWINGS

These and other aspects of the invention will be apparent and elucidated from the embodiments described in the following with reference to the drawing in which.

DETAILED DESCRIPTION OF EMBODIMENTS

Figure 1:
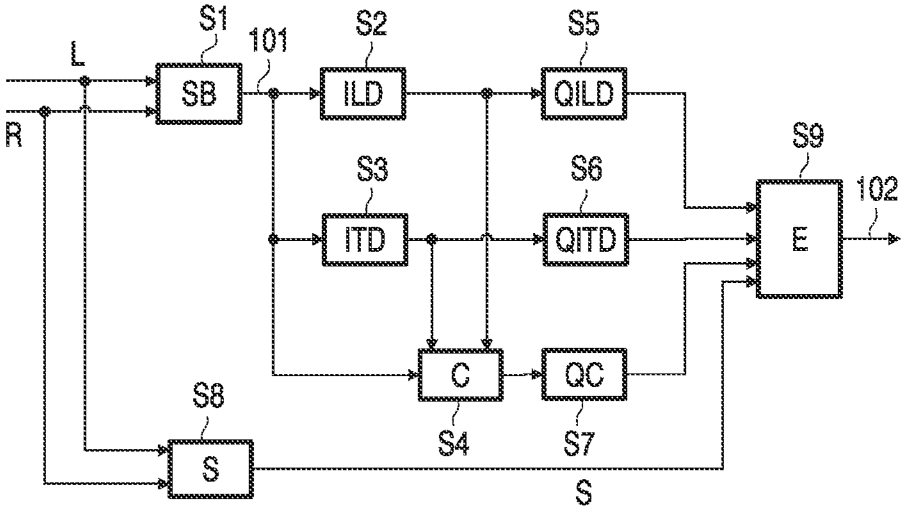
FIG. 1 shows a flow diagram of a method of encoding an audio signal according to an embodiment of the invention.

FIG. 1 shows a flow diagram of a method of encoding an audio signal according to an embodiment of the invention.

In an initial step S1, the incoming signals L and R are split up in band-pass signals (preferably with a bandwidth which increases with frequency), indicated by reference numeral 101, such that their parameters can be analyzed as a function of time. One possible method for time/frequency slicing is to use time-windowing followed by a transform operation, but also time-continuous methods could be used (e.g., filterbanks). The time and frequency resolution of this process is preferably adapted to the signal; for transient signals a fine time resolution (in the order of a few milliseconds) and a coarse frequency resolution is preferred, while for non-transient signals a finer frequency resolution and a coarser time resolution (in the order of tens of milliseconds) is preferred. Subsequently, in step S2, the level difference (ILD) of corresponding subband signals is determined; in step S3 the time difference (ITD or IPD) of corresponding subband signals is determined; and in step S4 the amount of similarity or dissimilarity of the waveforms which cannot be accounted for by ILDs or ITDs, is described. The analysis of these parameters is discussed below.

Step S2: Analysis of ILDs

The ILD is determined by the level difference of the signals at a certain time instance for a given frequency band. One method to determine the ILD is to measure the root mean square (rms) value of the corresponding frequency band of both input channels and compute the ratio of these rms values (preferably expressed in dB).

Step S3: Analysis of the ITDs

The ITDs are determined by the time or phase alignment which gives the best match between the waveforms of both channels. One method to obtain the ITD is to compute the cross-correlation function between two corresponding subband signals and searching for the maximum. The delay that corresponds to this maximum in the cross-correlation function can be used as ITD value. A second method is to compute the analytic signals of the left and right subband (i.e., computing phase and envelope values) and use the (average) phase difference between the channels as IPD parameter.

Step S4: Analysis of the Correlation

The correlation is obtained by first finding the ILD and ITD that gives the best match between the corresponding subband signals and subsequently measuring the similarity of the waveforms after compensation for the ITD and/or ILD. Thus, in this framework, the correlation is defined as the similarity or dissimilarity of corresponding subband signals which can not be attributed to ILDs and/or ITDs. A suitable measure for this parameter is the maximum value of the cross-correlation function (i.e., the maximum across a set of delays). However, also other measures could be used, such as the relative energy of the difference signal after ILD and/or ITD compensation compared to the sum signal of corresponding subbands (preferably also compensated for ILDs and/or ITDs). This difference parameter is basically a linear transformation of the (maximum) correlation.

In the subsequent steps S5, S6, and S7, the determined parameters are quantized. An important issue of transmission of parameters is the accuracy of the parameter representation (i.e., the size of quantization errors), which is directly related to the necessary transmission capacity. In this section, several issues with respect to the quantization of the spatial parameters will be discussed. The basic idea is to base the quantization errors on so-called just-noticeable differences (JNDs) of the spatial cues. To be more specific, the quantization error is determined by the sensitivity of the human auditory system to changes in the parameters. Since the sensitivity to changes in the parameters strongly depends on the values of the parameters itself, we apply the following methods to determine the discrete quantization steps.

Step S5: Quantization of ILDs

It is known from psychoacoustic research that the sensitivity to changes in the ILD depends on the ILD itself. If the ILD is expressed in dB, deviations of approximately 1 dB from a reference of 0 dB are detectable, while changes in the order of 3 dB are required if the reference level difference amounts 20 dB. Therefore, quantization errors can be larger if the signals of the left and right channels have a larger level difference. For example, this can be applied by first measuring the level difference between the channels, followed by a non-linear (compressive) transformation of the obtained level difference and subsequently a linear quantization process, or by using a lookup table for the available ILD values which have a non-linear distribution. The embodiment below gives an example of such a lookup table.

Step S6: Quantization of the ITDs

The sensitivity to changes in the ITDs of human subjects can be characterized as having a constant phase threshold. This means that in terms of delay times, the quantization steps for the ITD should decrease with frequency. Alternatively, if the ITD is represented in the form of phase differences, the quantization steps should be independent of frequency. One method to implement this is to take a fixed phase difference as quantization step and determine the corresponding time delay for each frequency band. This ITD value is then used as quantization step. Another method is to transmit phase differences which follow a frequency-independent quantization scheme. It is also known that above a certain frequency, the human auditory system is not sensitive to ITDs in the fine structure waveforms. This phenomenon can be exploited by only transmitting ITD parameters up to a certain frequency (typically 2 kHz).

A third method of bitstream reduction is to incorporate ITD quantization steps that depend on the ILD and/or the correlation parameters of the same subband. For large ILDs, the ITDs can be coded less accurately. Furthermore, if the correlation it very low, it is known that the human sensitivity to changes in the ITD is reduced. Hence larger ITD quantization errors may be applied if the correlation is small. An extreme example of this idea is to not transmit ITDs at all if the correlation is below a certain threshold and/or if the ILD is sufficiently large for the same subband (typically around 20 dB).

Step S7: Quantization of the Correlation

The quantization error of the correlation depends on (1) the correlation value itself and possibly (2) on the ILD. Correlation values near +1 are coded with a high accuracy (i.e., a small quantization step), while correlation values near 0 are coded with a low accuracy (a large quantization step). An example of a set of non-linearly distributed correlation values is given in the embodiment. A second possibility is to use quantization steps for the correlation that depend on the measured ILD of the same subband: for large ILDs (i.e., one channel is dominant in terms of energy), the quantization errors in the correlation become larger. An extreme example of this principle would be to not transmit correlation values for a certain subband at all if the absolute value of the ILD for that subband is beyond a certain threshold.

In step S8, a monaural signal S is generated from the incoming audio signals, e.g. as a sum signal of the incoming signal components, by determining a dominant signal, by generating a principal component signal from the incoming signal components, or the like. This process preferably uses the extracted spatial parameters to generate the mono signal, i.e., by first aligning the subband waveforms using the ITD or IPD before combination.

Finally, in step S9, a coded signal 102 is generated from the monaural signal and the determined parameters. Alternatively, the sum signal and the spatial parameters may be communicated as separate signals via the same or different channels.

Figure 2:
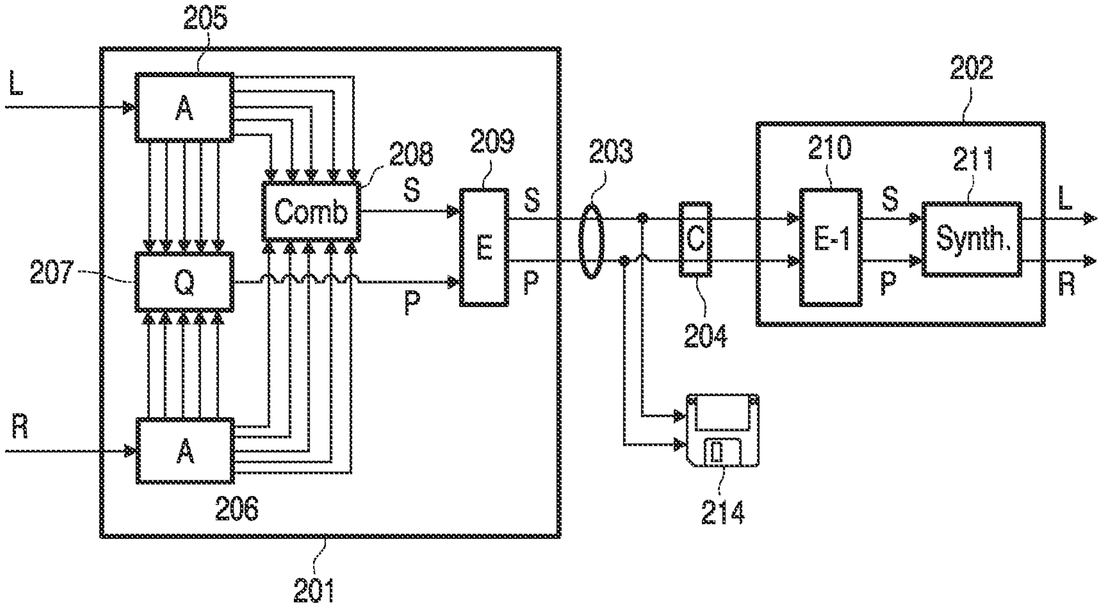
FIG. 2 shows a schematic block diagram of a coding system according to an embodiment of the invention.

It is noted that the above method may be implemented by a corresponding arrangement, e.g. implemented as general- or special-purpose programmable microprocessors, Digital Signal Processors (DSP), Application Specific Integrated Circuits (ASIC), Programmable Logic Arrays (PLA), Field Programmable Gate Arrays (FPGA), special purpose electronic circuits, etc., or a combination thereof FIG. 2 shows a schematic block diagram of a coding system according to an embodiment of the invention. The system comprises an encoder 201 and a corresponding decoder 202. The decoder 201 receives a stereo signal with two components L and R and generates a coded signal 203 comprising a sum signal S and spatial parameters P which are communicated to the decoder 202. The signal 203 may be communicated via any suitable communications channel 204. Alternatively or additionally, the signal may be stored on a removable storage medium 214, e.g. a memory card, which may be transferred from the encoder to the decoder.

The encoder 201 comprises analysis modules 205 and 206 for analyzing spatial parameters of the incoming signals L and R, respectively, preferably for each time/frequency slot. The encoder further comprises a parameter extraction module 207 that generates quantized spatial parameters; and a combiner module 208 that generates a sum (or dominant) signal is consisting of a certain combination of the at least two input signals. The encoder further comprises an encoding module 209 which generates a resulting coded signal 203 comprising the monaural signal and the spatial parameters. In one embodiment, the module 209 further performs one or more of the following functions: bit rate allocation, framing, lossless coding, etc.

Synthesis (in the decoder 202) is performed by applying the spatial parameters to the sum signal to generate left and right output signals. Hence, the decoder 202 comprises a decoding module 210 which performs the inverse operation of module 209 and extracts the sum signal S and the parameters P from the coded signal 203. the decoder further comprises a synthesis module 211 which recovers the stereo components L and R from the sum (or dominant) signal and the spatial parameters.

In this embodiment, the spatial parameter description is combined with a monaural (single channel) audio coder to encode a stereo audio signal. It should be noted that although the described embodiment works on stereo signals, the general idea can be applied to n-channel audio signals, with n>1.

In the analysis modules 205 and 206, the left and right incoming signals L and R, respectively, are split up in various time frames (e.g. each comprising 2048 samples at 44.1 kHz sampling rate) and windowed with a square-root Hanning window. Subsequently, FFTs are computed. The negative FFT frequencies are discarded and the resulting FFTs are subdivided into groups (subbands) of FFT bins. The number of FFT bins that are combined in a subband g depends on the frequency: at higher frequencies more bins are combined than at lower frequencies. In one embodiment, FFT bins corresponding to approximately 1.8 ERBs (Equivalent Rectangular Bandwidth) are grouped, resulting in 20 subbands to represent the entire audible frequency range. The resulting number of FFT bins S[g] of each subsequent subband (starting at the lowest frequency) is

S=[4 4 4 5 6 8 9 12 13 17 21 25 30 38 45 55 68 82 100 477]

Thus, the first three subbands contain 4 FFT bins, the fourth subband contains 5 FFT bins, etc. For each subband, the corresponding ILD, ITD and correlation (r) are computed. The ITD and correlation are computed simply by setting all FFT bins which belong to other groups to zero, multiplying the resulting (band-limited) FFTs from the left and right channels, followed by an inverse FFT transform. The resulting cross-correlation function is scanned for a peak within an interchannel delay between −64 and +63 samples. The internal delay corresponding to the peak is used as ITD value, and the value of the cross-correlation function at this peak is used as this subband's interchannel correlation. Finally, the ILD is simply computed by taking the power ratio of the left and right channels for each subband.

In the combiner module 208, the left and right subbands are summed after a phase correction (temporal alignment). This phase correction follows from the computed ITD for that subband and consists of delaying the left-channel subband with ITD/2 and the right-channel subband with −ITD/2. The delay is performed in the frequency domain by appropriate modification of the phase angles of each FFT bin. Subsequently, the sum signal is computed by adding the phase-modified versions of the left and right subband signals. Finally, to compensate for uncorrelated or correlated addition, each subband of the sum signal is multiplied with sqrt (2/(1+r)), with r the correlation of the corresponding subband. If necessary, the sum signal can be converted to the time domain by (1) inserting complex conjugates at negative frequencies, (2) inverse FFT, (3) windowing, and (4) overlap-add.

In the parameter extraction module 207, the spatial parameters are quantized. ILDs (in dB) are quantized to the closest value out of the following set I:

I=[−19 −16 −13 −10 −8 −6 −4 −2 0 2 4 6 8 10 13 16 19]

ITD quantization steps are determined by a constant phase difference in each subband of 0.1 rad. Thus, for each subband, the time difference that corresponds to 0.1 rad of the subband center frequency is used as quantization step. For frequencies above 2 kHz, no ITD information is transmitted.

Interchannel correlation values r are quantized to the closest value of the following ensemble R:

R=[1 0.95 0.9 0.82 0.75 0.6 0.3 0]

This will cost another 3 bits per correlation value.

If the absolute value of the (quantized) ILD of the current subband amounts 19 dB, no ITD and correlation values are transmitted for this subband. If the (quantized) correlation value of a certain subband amounts zero, no ITD value is transmitted for that subband.

In this way, each frame requires a maximum of 233 bits to transmit the spatial parameters. With a framelength of 1024 frames, the maximum bitrate for transmission amounts 10.25 kbit/s. It should be noted that using entropy coding or differential coding, this bitrate can be reduced further.

The decoder comprises a synthesis module 211 where the stereo signal is synthesized form the received sum signal and the spatial parameters. Hence, for the purpose of this description it is assumed that the synthesis module receives a frequency-domain representation of the sum signal as described above. This representation may be obtained by windowing and FFT operations of the time-domain waveform. First, the sum signal is copied to the left and right output signals. Subsequently, the correlation between the left and right signals is modified with a decorrelator. In a preferred embodiment, a decorrelator as described below is used. Subsequently, each subband of the left signal is delayed by −ITD/2, and the right signal is delayed by ITD/2 given the (quantized) ITD corresponding to that subband. Finally, the left and right subbands are scaled according to the ILD for that subband. In one embodiment, the above modification is performed by a filter as described below. To convert the output signals to the time domain, the following steps are performed: (1) inserting complex conjugates at negative frequencies, (2) inverse FFT, (3) windowing, and (4) overlap-add.

Figure 3:
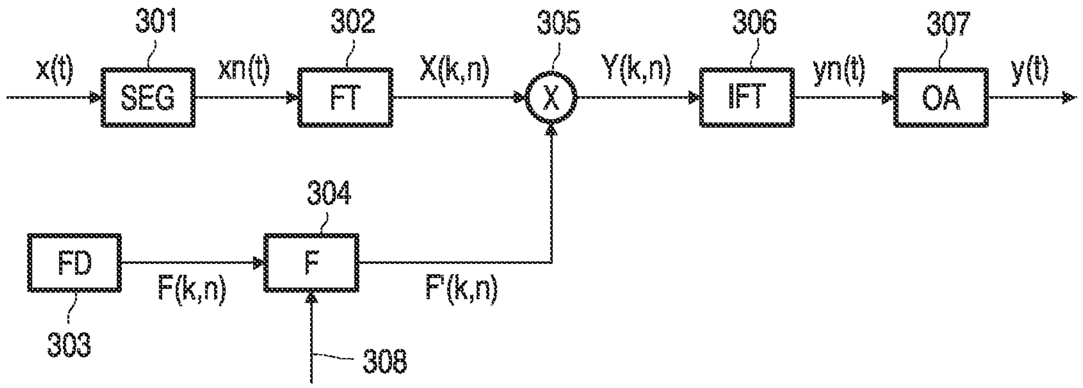
FIG. 3 illustrates a filter method for use in the synthesizing of the audio signal.

FIG. 3 illustrates a filter method for use in the synthesizing of the audio signal. In an initial step 301, the incoming audio signal x(t) is segmented into a number of frames. The segmentation step 301 splits the signal into frames $x_n(t)$ of a suitable length, for example in the range 500-5000 samples, e.g. 1024 or 2048 samples.

Preferably, the segmentation is performed using overlapping analysis and synthesis window functions, thereby suppressing artefacts which may be introduced at the frame boundaries (see e.g. Princen, J. P., and Bradley, A. B.: "Analysis/synthesis filterbank design based on time domain aliasing cancellation", IEEE transactions on Acoustics, Speech and Signal processing, Vol. ASSP 34, 1986).

In step 302, each of the frames $x_n(t)$ is transformed into the frequency domain by applying a Fourier transformation, preferably implemented as a Fast Fourier Transform (FFT). The resulting frequency representation of the n-th frame $x_n(t)$ comprises a number of frequency components X(k,n) where the parameter n indicates the frame number and the parameter k indicates the frequency component or frequency bin corresponding to a frequency $\omega_k$, 0<k<K. In general, the frequency domain components X(k,n) are complex numbers.

In step 303, the desired filter for the current frame is determined according to the received time-varying spatial parameters. The desired filter is expressed as a desired filter response comprising a set of K complex weight factors F(k, n), 0<k<K, for the n-th frame. The filter response F(k,n) may be represented by two real numbers, i.e. its amplitude a(k,n) and its phase φ(k,n) according to F(k,n)=a(k,n)·exp[jφ(k,n)].

In the frequency domain, the filtered frequency components are Y(k,n)=F(k,n)·X(k,n), i.e. they result from a multiplication of the frequency components X(k,n) of the input signal with the filter response F(k,n). As will be apparent to a skilled person, this multiplication in the frequency domain corresponds to a convolution of the input signal frame $x_n(t)$ with a corresponding filter $f_n(t)$.

In step 304, the desired filter response F(k,n) is modified before applying it to the current frame X(k,n). In particular, the actual filter response F'(k,n) to be applied is determined as a function of the desired filter response F(k,n) and of information 308 about previous frames. Preferably, this information comprises the actual and/or desired filter response of one or more previous frames, according to $$F'(k,n) = a'(k,n)\cdot\exp[j\varphi'(k,n)] = \Phi[F(k,n), F(k,n-1), F(k,n-2), \ldots, F'(k,n-1), F'(k,n-2), \ldots].$$

Hence, by making the actual filter response dependant of the history of previous filter responses, artifacts introduced by changes in the filter response between consecutive frames may be efficiently suppressed. Preferably, the actual form of the transform function Φ is selected to reduce overlap-add artifacts resulting from dynamically-varying filter responses.

For example, the transform function Φ may be a function of a single previous response function, e.g. $F'(k,n)=\Phi_1[F(k,n), F(k,n-1)]$ or $F'(k,n)=\Phi_2[F(k,n), F'(k,n-1)]$. In another embodiment, the transform function may comprise a floating average over a number of previous response functions, e.g. a filtered version of previous response functions, or the like. Preferred embodiments of the transform function Φ will be described in greater detail below.

In step 305, the actual filter response F'(k,n) is applied to the current frame by multiplying the frequency components X(k,n) of the current frame of the input signal with the corresponding filter response factors F'(k,n) according to Y(k, n)= F'(k,n)·X(k,n).

In step 306, the resulting processed frequency components Y(k,n) are transformed back into the time domain resulting in filtered frames $y_n(t)$. Preferably, the inverse transform is implemented as an Inverse Fast Fourier Transform (IFFT).

Finally, in step 307, the filtered frames are recombined to a filtered signal y(t) by an overlap-add method. An efficient implementation of such an overlap add method is disclosed in Bergmans, J. W. M.: "Digital baseband transmission and recording", Kluwer, 1996.

In one embodiment, the transform function Φ of step 304 is implemented as a phase-change limiter between the current and the previous frame. According to this embodiment, the phase change δ(k) of each frequency component F(k,n) compared to the actual phase modification φ'(k,n−1) applied to the previous sample of the corresponding frequency component is computed, i.e. δ(k)=φ(k,n)−φ'(k,n−1).

Subsequently, the phase component of the desired filter F(k,n) is modified in such a way that the phase change across frames is reduced, if the change would result in overlap-add artifacts. According to this embodiment, this is achieved by ensuring that the actual phase difference does not exceed a predetermined threshold c, e.g. by simply cutting of the phase difference, according to $$\begin{cases} F(k,n), & \text{if } |\delta(k)| < c \\ F'(k,n-1)\cdot e^{j\cdot c\cdot sign[\delta(k)]}, & \text{otherwise} \end{cases} \quad (1)$$

The threshold value c may be a predetermined constant, e.g. between π/8 and π/3 rad. In one embodiment, the threshold c may not be a constant but e.g. a function of time, frequency, and/or the like. Furthermore, alternatively to the above hard limit for the phase change, other phase-change-limiting functions may be used.

In general, in the above embodiment, the desired phase-change across subsequent time frames for individual frequency components is transformed by an input-output function P(δ(k)) and the actual filter response F'(k,n) is given by $$F'(k,n)=F'(k,n-1)\cdot\exp[jP(\delta(k))]. \quad (2)$$

Hence, according to this embodiment, a transform function P of the phase change across subsequent time frames is introduced.

In another embodiment of the transformation of the filter response, the phase limiting procedure is driven by a suitable measure of tonality, e.g. a prediction method as described below. This has the advantage that phase jumps between consecutive frames which occur in noise-like signals may be excluded from the phase-change limiting procedure according to the invention. This is an advantage, since limiting such phase jumps in noise like signals would make the noise-like signal sound more tonal which is often perceived as synthetic or metallic.

According to this embodiment, a predicted phase error $\theta(k)=\phi(k,n)-\phi(k,n-1)-\omega_k\cdot h$ is calculated. Here, $\omega_k$ denotes the frequency corresponding to the k-th frequency component and h denotes the hop size in samples. Here, the term hop size refers to the difference between two adjacent window centers, i.e. half the analysis length for symmetric windows. In the following, it is assumed that the above error is wrapped to the interval $[-\pi,+\pi]$.

Subsequently, a prediction measure $P_k$ for the amount of phase predictability in the k-th frequency bin is calculated according to $P_k=(\pi-|\theta(k)|)/\pi\in([0,1]$, where |·| denotes the absolute value.

Hence, the above measure $P_k$ yields a value between 0 and 1 corresponding to the amount of phase-predictability in the k-th frequency bin. If $P_k$ is close to 1, the underlying signal may be assumed to have a high degree of tonality, i.e. has a substantially sinusoidal waveform. For such a signal, phase jumps are easily perceivable, e.g. by the listener of an audio signal. Hence, phase jumps should preferably be removed in this case. On the other hand, if the value of $P_k$ is close to 0, the underlying signal may be assumed to be noisy. For noisy signals phase jumps are not easily perceived and may, therefore, be allowed.

Accordingly, the phase limiting function is applied if $P_k$ exceeds a predetermined threshold, i.e. $P_k>A$, resulting in the actual filter response F'(k,n) according to $$F'(k,n)=\begin{cases} F(k,n), & \text{if } P_k < A \\ F'(k,n-1)\cdot e^{j\cdot P[\delta(k)]}, & \text{otherwise.} \end{cases}$$

Here, A is limited by the upper and lower boundaries of P which are +1 and 0, respectively. The exact value of A depends on the actual implementation. For example, A may be selected between 0.6 and 0.9.

It is understood that, alternatively, any other suitable measure for estimating the tonality may be used. In yet another embodiment, the allowed phase jump c described above may be made dependant on a suitable measure of tonality, e.g. the measure $P_k$ above, thereby allowing for larger phase jumps if $P_k$ is large and vice versa.

Figure 4:
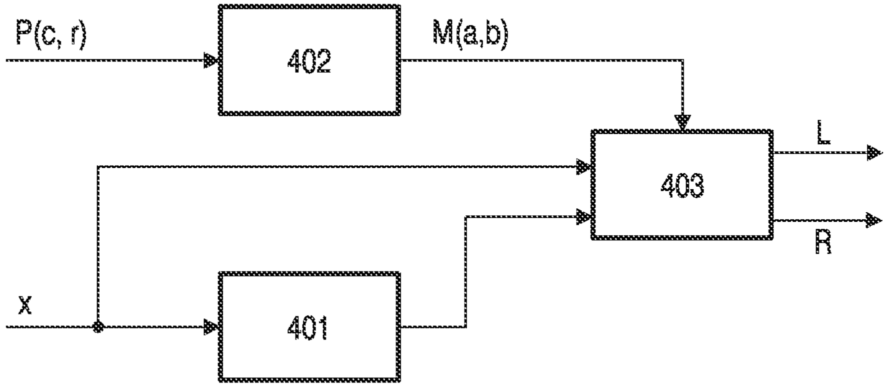
FIG. 4 illustrates a decorrelator for use in the synthesizing of the audio signal.

FIG. 4 illustrates a decorrelator for use in the synthesizing of the audio signal. The decorrelator comprises an all-pass filter 401 receiving the monoaural signal x and a set of spatial parameters P including the interchannel cross-correlation r and a parameter indicative of the channel difference c. It is noted that the parameter c is related to the interchannel level difference by ILD=k·log(c), where k is a constant, i.e. ILD is proportional to the logarithm of c.

Preferably, the all-pass filter comprises a frequency-dependant delay providing a relatively smaller delay at high frequencies than at low frequencies. This may be achieved by replacing a fixed-delay of the all-pass filter with an all-pass filter comprising one period of a Schroeder-phase complex (see e.g. M. R. Schroeder, "Synthesis of low-peak-factor signals and binary sequences with low autocorrelation", IEEE Transact. Inf. Theor., 16:85-89, 1970). The decorrelator further comprises an analysis circuit 402 that receives the spatial parameters from the decoder and extracts the interchannel cross-correlation r and the channel difference c. The circuit 402 determines a mixing matrix M(α,β) as will be described below. The components of the mixing matrix are fed into a transformation circuit 403 which further receives the input signal x and the filtered signal $H\otimes x$. The circuit 403 performs a mixing operation according to $$\begin{pmatrix} L \\ R \end{pmatrix} = M(\alpha,\beta)\cdot\begin{pmatrix} x \\ H\otimes x \end{pmatrix} \quad (3)$$

resulting in the output signals L and R.

The correlation between the signals L and R may be expressed as an angle α between vectors representing the L and R signal, respectively, in a space spanned by the signals x and $H\otimes x$, according to r=cos(α). Consequently, any pair of vectors that exhibits the correct angular distance has the specified correlation.

Hence, a mixing matrix M which transforms the signals x and $H\otimes x$ into signals L and R with a predetermined correlation r may be expressed as follows:

$$M=\begin{pmatrix} \cos(\alpha/2) & \sin(\alpha/2) \\ \cos(-\alpha/2) & \sin(-\alpha/2) \end{pmatrix}. \quad (4)$$

Thus, the amount of all-pass filtered signal depends on the desired correlation. Furthermore, the energy of the all-pass signal component is the same in both output channels (but with a 180° phase shift).

It is noted that the case where the matrix M is given by $$M=\sqrt{2}\cdot\begin{pmatrix} 1 & 1 \\ 1 & -1 \end{pmatrix}, \quad (5)$$

i.e. the case where α=90° corresponding to uncorrelated output signals (r=0), corresponds to a Lauridsen decorrelator.

In order to illustrate a problem with the matrix of eqn. (5), we assume a situation with an extreme amplitude panning towards the left channel, i.e. a case where a certain signal is present in the left channel only. We further assume that the desired correlation between the outputs is zero. In this case, the output of the left channel of the transformation of eqn. (3) with the mixing matrix of eqn. (5) yields $L=1/\sqrt{2}(x+H\otimes x)$.

Thus, the output consists of the original signal x combined with its all-passed filtered version $H \otimes x$.

However, this is an undesired situation, since the all-pass filter usually deteriorates the perceptual quality of the signal. Furthermore, the addition of the original signal and the filtered signal results in comb-filter effects, such as perceived coloration of the output signal. In this assumed extreme case, the best solution would be that the left output signal consists of the input signal. This way the correlation of the two output signals would still be zero.

In situations with more moderate level differences, the preferred situation is that the louder output channel contains relatively more of the original signal, and the softer output channel contains relatively more of the filtered signal. Hence, in general, it is preferred to maximize the amount of the original signal present in the two outputs together, and to minimize the amount of the filtered signal.

According to this embodiment, this is achieved by introducing a different mixing matrix including an additional common rotation:

$$M = C \cdot \begin{pmatrix} \cos(\beta + \alpha/2) & \sin(\beta + \alpha/2) \\ \cos(\beta - \alpha/2) & \sin(\beta - \alpha/2) \end{pmatrix}. \quad (6)$$

Here β is an additional rotation, and C is a scaling matrix which ensures that the relative level difference between the output signals equals c, i.e.

$$C = \begin{pmatrix} \frac{c}{1+c} & 0 \\ 0 & \frac{1}{1+c} \end{pmatrix}.$$

Inserting the matrix of eqn. (6) in eqn. (3) yields the output signals generated by the matrixing operation according to this embodiment:

$$\begin{pmatrix} L \\ R \end{pmatrix} = \begin{pmatrix} \frac{c}{1+c} & 0 \\ 0 & \frac{1}{1+c} \end{pmatrix} \cdot \begin{pmatrix} \cos(\beta + \alpha/2) & \sin(\beta + \alpha/2) \\ \cos(\beta - \alpha/2) & \sin(\beta - \alpha/2) \end{pmatrix} \cdot \begin{pmatrix} x \\ H \otimes x \end{pmatrix}.$$

Hence, the output signals L and R still have an angular difference α, i.e. the correlation between the L and R signals is not affected by the scaling of the signals L and R according to the desired level difference and the additional rotation by the angle β of both the L and the R signal.

As mentioned above, preferably, the amount of the original signal x in the summed output of L and R should be maximized. This condition may be used to determine the angle β, according to $$\frac{\partial(L+R)}{\partial x} = 0,$$

which yields the condition:

$$\tan(\beta) = \frac{1-c}{1+c} \cdot \tan(\alpha/2).$$

In summary, this application describes a psycho-acoustically motivated, parametric description of the spatial attributes of multichannel audio signals. This parametric description allows strong bitrate reductions in audio coders, since only one monaural signal has to be transmitted, combined with (quantized) parameters which describe the spatial properties of the signal. The decoder can form the original amount of audio channels by applying the spatial parameters. For near-CD-quality stereo audio, a bitrate associated with these spatial parameters of 10 kbit/s or less seems sufficient to reproduce the correct spatial impression at the receiving end. This bitrate can be scaled down further by reducing the spectral and/or temporal resolution of the spatial parameters and/or processing the spatial parameters using losless compression algorithms.

It should be noted that the above-mentioned embodiments illustrate rather than limit the invention, and that those skilled in the art will be able to design many alternative embodiments without departing from the scope of the appended claims.

For example, the invention has primarily been described in connection with an embodiment using the two localization cues ILD and ITD/IPD. In alternative embodiments, other localization cues may be used. Furthermore, in one embodiment, the ILD, the ITD/IPD, and the interchannel cross-correlation may be determined as described above, but only the interchannel cross-correlation is transmitted together with the monaural signal, thereby further reducing the required bandwidth/storage capacity for transmitting/storing the audio signal. Alternatively, the interchannel cross-correlation and one of the ILD and ITD/TPD may be transmitted. In these embodiments, the signal is synthesized from the monaural signal on the basis of the transmitted parameters only.

In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements.

The invention can be implemented by means of hardware comprising several distinct elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. Decoding apparatus for decoding an encoded digital audio signal comprising at least a first and a second digital audio signal component, which have been encoded into a composite digital signal (X), wherein the composite digital signal is a wideband signal split into a plurality of composite digital subsignals, one for each of a plurality of frequency bands, the parameter signal also being split into a plurality of parameter sub signals, one for each of the plurality of frequency bands, and a parameter signal (P), the decoding apparatus comprising:

an input unit (210) for receiving a transmission signal, a demultiplexer unit (210) for retrieving the composite digital signal and the parameter signal from the transmission signal, a decorrelator unit (401) for generating from the composite digital signal a decorrelated version of the composite digital signal and to generate from the composite digital sub signals a decorrelated version of the composite digital sub signals, a matrixing unit (403) for receiving the composite digital signal and the decorrelated version of the composite digital signal and generating there from a reproduction of the first and second digital audio signal component and to receive the composite digital sub signals and the decorrelated version of the composite digital sub signals and generating there from a reproduction of a plurality of sub signals for each of the first and second digital audio signal components, the reproduction of the first digital audio signal component being a linear combination of the composite digital signal and the decorrelated version of the composite digital signal, using multiplier coefficients that are dependent of the parameter signal, the reproduction of the second digital audio signal component being a linear combination of the composite digital signal and the decorrelated version of the composite digital signal, using multiplier coefficients that are dependent of the parameter signal, wherein a sub signal of the first digital audio signal component being a linear combination of a corresponding composite digital sub signal and the decorrelated version of the corresponding composite digital sub signal, using multiplier coefficients that are dependent of a corresponding one of said parameter sub signals, and a sub signal of the second digital audio signal component being a linear combination of a corresponding composite digital sub signal and the decorrelated version of the corresponding composite digital sub signal, using multiplier coefficients that are dependent of a corresponding one of said parameter sub signals, and a transform unit (307) to transform the sub signals of the first and second digital audio signal components into said reproductions of said first and second digital audio signal components.

2. Decoding apparatus for decoding an encoded digital audio signal comprising at least a first and a second digital audio signal component, which have been encoded into a composite digital signal (X) and a parameter signal (P), the decoding apparatus comprising:

an input unit (210) for receiving a transmission signal, a demultiplexer unit (210) for retrieving the composite digital signal and the parameter signal from the transmission signal, a decorrelator unit (401) for generating from the composite digital signal a decorrelated version of the composite digital signal, a matrixing unit (403) for receiving the composite digital signal and the decorrelated version of the composite digital signal and generating there from a reproduction of the first and second digital audio signal component, the reproduction of the first digital audio signal component being a linear combination of the composite digital signal and the decorrelated version of the composite digital signal, using multiplier coefficients that are dependent of the parameter signal, the reproduction of the second digital audio signal component being a linear combination of the composite digital signal and the decorrelated version of the composite digital signal, using multiplier coefficients that are dependent of the parameter signal wherein the composite digital sub signals are split into consecutive time signals, one for each of consecutive time intervals in the time domain, the parameter sub signals also being split into parameter sub signals of each of the consecutive time intervals, the decorrelator unit (401) further being adapted to generate for each consecutive time interval and each composite digital sub signal from said composite digital sub signals a decorrelated version of said composite digital sub signal, the matrixing unit (403) further being adapted to generate for each consecutive time interval from each composite digital sub signal and its decorrelated version thereof in said interval, a reproduction of a sub signal for each of the first and second digital audio signal components, a sub signal of the first digital audio signal component in said time interval being a linear combination of a corresponding composite digital sub signal in said time interval and the decorrelated version of the corresponding composite digital sub signal in said time interval, using multiplier coefficients that are dependent of the parameter sub signal for said time interval, a sub signal of the second digital audio signal component in said time interval being a linear combination of a corresponding composite digital sub signal in said time interval and the decorrelated version of the corresponding composite digital sub signal in said time interval, using multiplier coefficients that are dependent of the parameter sub signal for said time interval.

3. Decoding apparatus as claimed in claim 2, characterized in that the parameter signal comprises a first parameter signal component (r) which is a measure of the similarity of waveforms of the reproductions of the at least first and second digital audio signals, said measure of similarity corresponding to a value of a cross correlation function between the reproductions of said at least first and second digital audio signal components, said value being substantially equal to the maximum of said cross correlation function.

4. Decoding apparatus as claimed in claim 3, characterized in that the parameter signal comprises a second parameter signal component (c) which is representative of the relative level difference between the reproductions of the first and second digital audio signal components.

5. Decoding apparatus as claimed in claim 4, characterized in that the matrixing unit equals $$M = C\begin{pmatrix} \cos(\beta+\alpha/2) & \sin(\beta+\alpha/2) \\ \cos(\beta-\alpha/2) & \sin(\beta-\alpha/2) \end{pmatrix}$$

wherein β is an angle value related to the first parameter signal component and C is related to the second parameter signal component.

6. Decoding apparatus as claimed in claim 5, characterized in that the following relationship exists between a and the first parameter signal component:

$$r=\cos(\alpha),$$

wherein r is the value of the maximum of the cross correlation function.

7. Decoding apparatus as claimed in claim 5, characterized in that C is a 2×2 matrix and the following relationship exists between matrix coefficients of C and the second parameter signal component (c)

$$C = \begin{pmatrix} \frac{c}{1+c} & 0 \\ 0 & \frac{1}{1+c} \end{pmatrix}$$

where c equals the relative level difference between said signals.

8. Decoding unit as claimed in claim 5, characterized in that the following relationship exists between α and β:

$$\tan(\beta) = \frac{1-c}{1+c} \cdot \tan(\alpha/2)$$

9. Decoding apparatus as claimed in any of the preceding claims, characterized in that the decorrelator unit is adapted to delay the composite digital signal so as to obtain the decorrelated composite digital signal.

10. Decoding apparatus as claimed in claim 9, characterized in that the delay is a frequency dependent delay.

* * * * *

UNITED STATES PATENT AND TRADEMARK OFFICE

CERTIFICATE OF CORRECTION

PATENT NO. : 8,331,572 B2
APPLICATION NO. : 12/509529
DATED : December 11, 2012
INVENTOR(S) : Dirk Jeroen Breebaart and Steven Leonardus Josephus Dimphina Elisabeth Van De Par It is certified that error appears in the above-identified patent and that said Letters Patent is hereby corrected as shown below:

In the Claims:

Column 16, line 60, insert the following text after “bands,” --and a parameter signal (P)--

Column 16, line 62, cancel the text “and a parameter signal (P),”

Signed and Sealed this
Eighteenth Day of June, 2013

Teresa Stanek Rea
*Acting Director of the United States Patent and Trademark Office*